US012663481B2

(12) United States Patent
Cheng et al.

(10) Patent No.: US 12,663,481 B2
(45) Date of Patent: Jun. 23, 2026

(54) ELECTROCHEMICAL STATE OF HEALTH ESTIMATING METHOD

(71) Applicant: Robert Bosch GmbH, Stuttgart (DE)

(72) Inventors: Lei Cheng, San Jose, CA (US);
Jonathan Braaten, Sunnyvale, CA
(US); Karim Gadelrab, Watertown,
MA (US); Weiqi Ji, Sunnyvale, CA
(US); Bjoern Stuehmeier, Santa Clara,
CA (US); Christina Johnston, Spanish
Fort, AL (US); Nathan Craig,
Sunnyvale, CA (US); **Jake
Christensen**, Elk Grove, CA (US)

(73) Assignee: Robert Bosch GmbH, Stuttgart (DE)

( * ) Notice: Subject to any disclaimer, the term of this
patent is extended or adjusted under 35
U.S.C. 154(b) by 151 days.

(21) Appl. No.: 18/391,181

(22) Filed: Dec. 20, 2023

(65) Prior Publication Data

US 2025/0208225 A1     Jun. 26, 2025

(51) Int. Cl.
*G01R 31/392*          (2019.01)
*G01R 31/367*          (2019.01)
*G01R 31/3842*         (2019.01)

(52) U.S. Cl.
CPC ......... *G01R 31/392* (2019.01); *G01R 31/367*
(2019.01); *G01R 31/3842* (2019.01)

(58) Field of Classification Search
CPC ................ G01R 31/392; G01R 31/367; G01R
31/3842; Y02E 60/50
See application file for complete search history.

(56) References Cited

U.S. PATENT DOCUMENTS

| | | | | |
|---|---|---|---|---|
| 8,970,178 | B2 * | 3/2015 | Berkowitz ............ | H01M 10/44 |
| | | | | 320/141 |
| 10,345,392 | B2 * | 7/2019 | Kondo .................. | G01R 31/392 |
| 10,664,562 | B2 * | 5/2020 | Balasingam ....... | G01R 31/3842 |
| 11,255,918 | B2 * | 2/2022 | Desai .................... | G01R 31/367 |
| 11,415,637 | B2 * | 8/2022 | Sarlashkar ......... | G01R 31/3835 |
| 12,130,334 | B2 * | 10/2024 | Pan ........................ | G04C 10/04 |
| 2003/0061182 | A1 * | 3/2003 | Singh ................... | G01R 31/392 |
| | | | | 706/2 |
| 2018/0261866 | A1 * | 9/2018 | Takahashi ............... | H01M 4/86 |
| 2022/0082626 | A1 * | 3/2022 | Lim ........................ | B60L 58/16 |
| 2022/0416264 | A1 | 12/2022 | Kim et al. | |

(Continued)

FOREIGN PATENT DOCUMENTS

| | | |
|---|---|---|
| CN | 115084593 A | 9/2022 |
| CN | 115469240 A | 12/2022 |

(Continued)

*Primary Examiner* — Akm Zakaria
(74) *Attorney, Agent, or Firm* — Brooks Kushman P.C.

(57)          ABSTRACT

An electrochemical state of health (SoH) estimating method.
The method includes receiving in-operation voltage and/or
current signals from a fuel cell stack during operation of the
fuel cell stack at one or more operational condition(s). The
method further includes comparing an in-operation voltage-
current relationship based on the in-operation voltage or
current signals at the operational condition(s) with a begin-
ning of life (BOL) voltage-current relationship at the same
or substantially the same operational condition(s) to obtain
a voltage-current comparison at the operational condition(s).
The method also includes estimating an SoH parameter in
response to the voltage-current comparison.

20 Claims, 7 Drawing Sheets

(56) References Cited

U.S. PATENT DOCUMENTS

2023/0261211 A1* 8/2023 Fang ..................... H01M 8/083
429/528
2023/0327154 A1* 10/2023 Ancimer ........... H01M 8/04679
429/400

FOREIGN PATENT DOCUMENTS

CN        115616433 A      1/2023
EP         3503274 A1      6/2019

* cited by examiner

600

ELECTROCHEMICAL STATE OF HEALTH ESTIMATING METHOD

TECHNICAL FIELD

The present disclosure relates to an electrochemical state of health estimating method. The electrochemical state of health estimating method may measure state of health contemporaneously with operation of a polymer electrolyte fuel cell stack.

BACKGROUND

One type of electrochemical cell is a device capable of generating electrical energy from chemical reactions (e.g., fuel cells). Fuel cells have shown promise as an alternative power source for vehicles and other transportation applications. Fuel cells operate with a renewable energy carrier, such as hydrogen. Fuel cells also operate without toxic emissions or greenhouse gases. An individual fuel cell includes a membrane electrode assembly (MEA) and two flow field plates. An individual fuel cell typically delivers 0.5 to 1.0 V. Individual fuel cells can be stacked together to form a fuel cell stack having higher voltage and power. One type of fuel cell is a proton-exchange membrane fuel cell (PEMFC).

SUMMARY

According to one embodiment, an electrochemical state of health (SoH) estimating method is disclosed. The method includes receiving in-operation voltage and/or current signals from a fuel cell stack during operation of the fuel cell stack at one or more operational condition(s). The method further includes comparing an in-operation voltage-current relationship based on the in-operation voltage and/or current signals at the operational condition(s) with a beginning of life (BOL) voltage-current relationship at the same or substantially the same operational condition(s) to obtain a voltage-current comparison at the operational condition(s). The method also includes estimating an SoH parameter in response to the voltage-current comparison.

According to one embodiment, an electrochemical state of health (SoH) estimating method is disclosed. The method includes receiving in-operation voltage and/or current signals from a cell stack during operation of the fuel cell stack at one or more operational condition(s). The method further includes comparing an in-operation voltage-current relationship based on the in-operation voltage and/or current signals at the operational condition(s) with a beginning of life (BOL) voltage-current relationship at the same or substantially the same operational condition(s) to obtain a voltage-current comparison at the operational condition(s). The method further includes receiving an impedance calculation based on a response to an alternating current (AC) signal sent to the fuel cell stack. The method also includes estimating an SoH parameter in response to the voltage-current comparison and the impedance calculation.

According to yet another embodiment, an electrochemical state of health (SoH) estimating method is disclosed. The method includes receiving in-operation voltage and/or current signals from a fuel cell stack during operation of the fuel cell stack at one or more operational condition(s). The method further includes comparing an in-operation voltage-current relationship based on the in-operation voltage or current signals at the operational condition(s) with a beginning of life (BOL) voltage-current relationship at the same or substantially the same operational condition(s) to obtain a voltage-current comparison at the operational condition(s). The method also includes estimating an SoH parameter in response to the voltage-current comparison. The method further includes transmitting the SoH parameter to a diagnostics system of the fuel cell stack.

DETAILED DESCRIPTION

Figure 1:
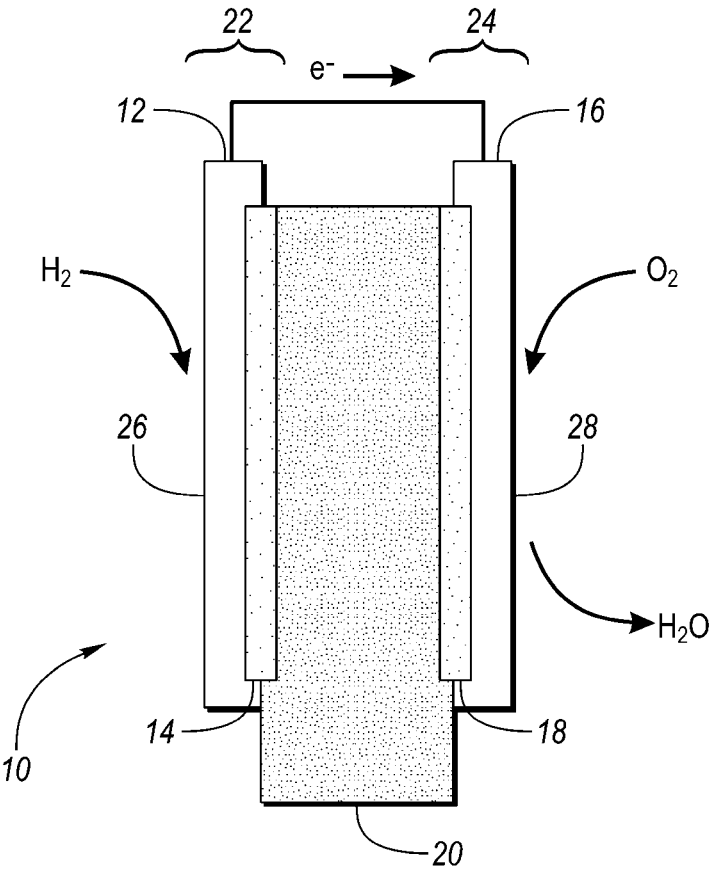
FIG. 1 depicts a schematic, side view of certain components of a proton-exchange membrane fuel cell.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the term "polymer" includes "oligomer," "copolymer," "terpolymer," and the like; the description of a group or class of materials as suitable or preferred for a given purpose in connection with the invention implies that mixtures of any two or more of the members of the group or class are equally suitable or preferred; molecular weights provided for any polymers refers to number average molecular weight; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

This invention is not limited to the specific embodiments and methods described below, as specific components and/or conditions may, of course, vary. Furthermore, the terminology used herein is used only for the purpose of describing embodiments of the present invention and is not intended to be limiting in any way.

As used in the specification and the appended claims, the singular form "a," "an," and "the" comprise plural referents unless the context clearly indicates otherwise. For example, reference to a component in the singular is intended to comprise a plurality of components.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

One or more embodiments are directed to a state of health (SoH) estimating method for a fuel cell. The fuel cell SoH monitoring method may be configured to operate in real time during the operation of the fuel cell such that estimated SoH values may be generated during operation of the fuel cell.

As described above, the fuel cell SOH monitoring method may monitor the SoH of a fuel cell. One type of fuel cell is a proton-exchange membrane fuel cell (PEMFC). The PEMFC may include a polymer electrolyte fuel cell stack. FIG. 1 depicts a schematic, side view of certain components of PEMFC 10 according to one embodiment. As shown in FIG. 1, fuel cell 10 includes anode catalyst support 12 coated with anode catalyst layer 14 formed of an anode catalyst material and cathode catalyst support 16 coated with cathode catalyst layer 18 formed of a cathode catalyst material. Polymer electrolyte material (PEM) 20 extends between anode catalyst support 12 and cathode catalyst support 16. The cathode catalyst material may be dispersed at an interface of PEM 20 and a current collector (not shown) supported by a cathode catalyst support. The current collector may be a porous carbon current collector. Anode catalyst layer 14 is positioned between anode catalyst support 12 and PEM 20. Cathode catalyst layer 18 is positioned between cathode catalyst support 16 and PEM 20. Anode 22 may generally refer to anode catalyst support 12 and anode catalyst layer 14. Cathode 24 may generally refer to cathode catalyst support 16, cathode catalyst layer 18, and the current collector. Fuel cell 10 also includes first and second gas diffusion layers (GDLs) (not shown). First GDL is adjacent outer surface 26 of anode 12 and second GDL is adjacent outer surface 28 of cathode 16.

Anode 22 is configured to perform a hydrogen oxidation reaction (reproduced as equation 1 below), while cathode 24 is configured to perform an oxygen reduction reaction (reproduced as equation 2 below) during operation of fuel cell 10.

$$H_2 \rightarrow 2H^+ + 2e^- \tag{1}$$

$$4H^+ + O_2 + 4e^- \rightarrow 2H_2O \tag{2}$$

Due to the complexity of transferring four (4) electrons, the oxygen reduction reaction is rate limiting and poses a significant challenge to the optimization of a catalyst material. The degradation of the cathode catalyst material in cathode catalyst layer 18 may be a significant source of overall performance loss over time in fuel cell 10.

During fuel cell operation, the cathode catalyst material may degrade primarily via (1) coarsening in which the average particle size increases, and/or (2) dealloying in which the M element is lost by dissolution in PEM 20. The coarsening and dealloying rates may be sensitive to global operating parameters (e.g., applied voltage and/or temperature) of fuel cell 10 and/or local environment parameters around each catalyst nanoparticle (e.g., hydration level and/or the structure of the carbon support).

Catalyst degradation contributes to the overall degradation and reduction of the overall SoH of the fuel cell. Fuel cell degradation may be measured by a combination of indirect metrics (e.g., overall fuel cell polarization) and direct, post-disassembly characterization of the fuel cell (e.g., following an accelerated aging protocol). While post-disassembly characterization (e.g., via electron microscopy and/or spectroscopy) may be very accurate, post-disassembly characterization does not provide a contemporaneous measurement of catalyst state of health during fuel cell operation. Moreover, post-disassembly characterization may be limited in throughput and the number of fuel cells that can be examined and characterized. Conversely, electrochemical polarization data may confuse catalyst degradation with numerous other sources of polarization in the fuel cell. Therefore, electrochemical polarization data may not be used to reliably measure catalyst SoH contemporaneously during fuel cell operation. Considering the foregoing, what is needed is an fuel cell SoH monitoring method configured to estimate SoH contemporaneously with operation of a fuel cell.

One method for monitoring the SoH of a fuel cell uses electrochemical impedance spectroscopy. Electrochemical impedance spectroscopy may use a direct current to direct current (DC/DC) converter to estimate SoH in a fuel cell. The DC/DC converter may apply an alternating current (AC) signal to a fuel cell system (e.g., a fuel cell stack or an individual fuel cell), thereby producing an impendence response.

Figure 2:
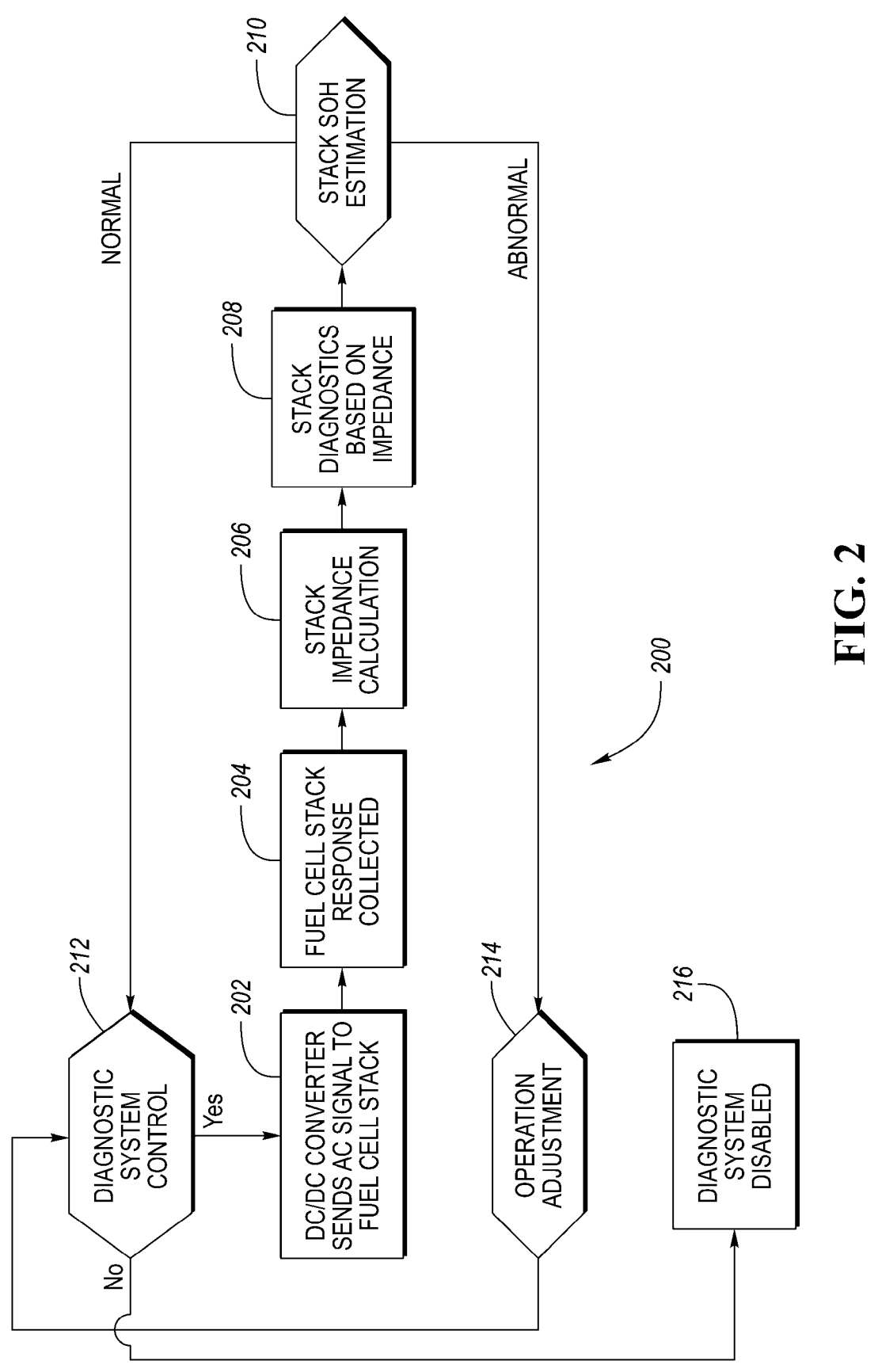
FIG. 2 depicts a flowchart including a method for analyzing an impedance response to determine a state of health (SoH) of a fuel cell system (e.g., a fuel cell stack or an individual fuel cell).

FIG. 2 depicts flowchart 200 including a method for analyzing an impedance response to determine an SoH of a fuel cell stack. The method may also be applied to an individual fuel cell within the fuel cell stack. The operations depicted in flowchart 10 may be rearranged, omitted, augmented, and/or modified depending on the implementation of the method for analyzing an impedance response to determine an SoH of a fuel cell stack. The method of FIG. 1 may cause a perturbation of an electrochemical system in equilibrium or in steady state (otherwise referred to as EIS) as part of the implementation of the SoH estimation method.

As depicted in operation 202, the method of flowchart 200 includes a DC/DC converter sending an AC signal to a fuel cell stack.

As depicted in operation 204, the method of flowchart 200 includes collecting a response (e.g., an electrical response) to the AC signal sent to the fuel cell stack. The response may be collected by an electrical sensor.

As depicted in operation 206, the method of flowchart 200 includes calculating a fuel cell stack impendence based on the response collected in operation 204. The calculating step may be carried out by a processing device, controller, or computer, which can include any existing programmable electronic control unit or dedicated electronic control unit.

As depicted in operation 208, the method of flowchart 200 includes performing fuel cell stack diagnostics (e.g., a fuel cell stack SoH estimation) based on the fuel cell stack impedance calculated in operation 206. The performing step may be carried out by a processing device, controller, or computer, which can include any existing programmable electronic control unit or dedicated electronic control unit.

As depicted in operation 210, the method depicted in flowchart 200 includes estimating a fuel cell stack SoH based on the fuel cell impedance. If the estimated fuel cell stack SoH is normal (e.g., indicating operation not leading to greater than normal degradation of the fuel cell stack), then control of the method is passed to a diagnostic system control module depicted by operation 212. If the estimated fuel cell stack SoH is abnormal (e.g., indicating operation leading to greater than normal degradation of the fuel cell stack), then control of the method is passed to operation 214.

As depicted in operation 212, the method of flowchart 200 includes determining whether the fuel cell system is under diagnostic system control. If the fuel cell system is under diagnostic system control, the method proceeds to operation 202 (i.e., the DC/DC converter sending an AC signal to the fuel cell stack). If the fuel cell system is not under diagnostic system control, the method proceeds to operation 216 (i.e., the diagnostic system is disabled).

As depicted in operation 214, the method of flowchart 200 attempts an operation adjustment in response to the abnormal fuel cell stack SoH condition. After the adjustment is performed, then control of the method depicted in flowchart 200 is passed to diagnostic system control module depicted by operation 212.

The SoH estimating method described in FIG. 2 uses a DC/DC converter. In one or more embodiments, an SoH estimating method is disclosed to estimate SoH using existing fuel cell system sensors. The SoH estimating method may be used in real-time during operation of the fuel cell system. Existing fuel cell sensors may include those fuel cell sensors that are standard with a fuel cell or are typically built into a fuel cell. Examples of existing sensors may include one or more current sensors, voltage sensors, temperature sensors, pressure sensors, and/or relative humidity sensors. In one or more embodiments, the monitoring method may be operated solely with existing sensors (e.g., without any other non-standard or specialized sensing devices). The use of standard sensors provides ease of implementation and cost effectiveness.

The SoH estimating method may be combined or coupled to a DC/DC EIS method (e.g., the method implementing the method depicted in FIG. 2). Alternatively, the SoH estimating method of one or more embodiments may be implemented independently a DC/DC EIS method. In such an implementation, the SoH estimating method may be a permanent stand-by option for logging fuel cell operational conditions during the lifetime of the fuel cell or a portion thereof.

In one or more embodiments, an SoH estimating method may implement a method that logs voltage-current signals at operational condition(s) (e.g., temperature, relative humidity, and/or pressure) during real time fuel cell operation. As a next step in the method of one or more embodiments, the voltage-current relationship may be compared with a beginning of life (BOL) voltage-current relationship under the same or substantially the same operational condition(s) (e.g., same or substantially the same temperature, relative humidity, and/or pressure). The BOL voltage-current relationships may be previously measured and/or defined via a performance model for the fuel cell stack at BOL.

A monitoring algorithm may be implemented within the SoH monitoring system of one or more embodiments. The monitoring algorithm may be implemented into a fuel cell diagnostic system. The algorithm may include an aging model correlating SoH measurements with current-voltage relationships (I-V characteristics) at any operating condition(s) (e.g., a combination of operating conditions). The monitoring algorithm integrated into a monitoring system may be used to determine one or more SoH parameters (e.g., decay and/or lifetime loss) at particular operating condition(s) in real-time (e.g., contemporaneously with operation of the fuel cell). The operating condition(s) may be adjusted to reduce SoH decay and/or lifetime loss.

Figures 3A, 3B, 3C:
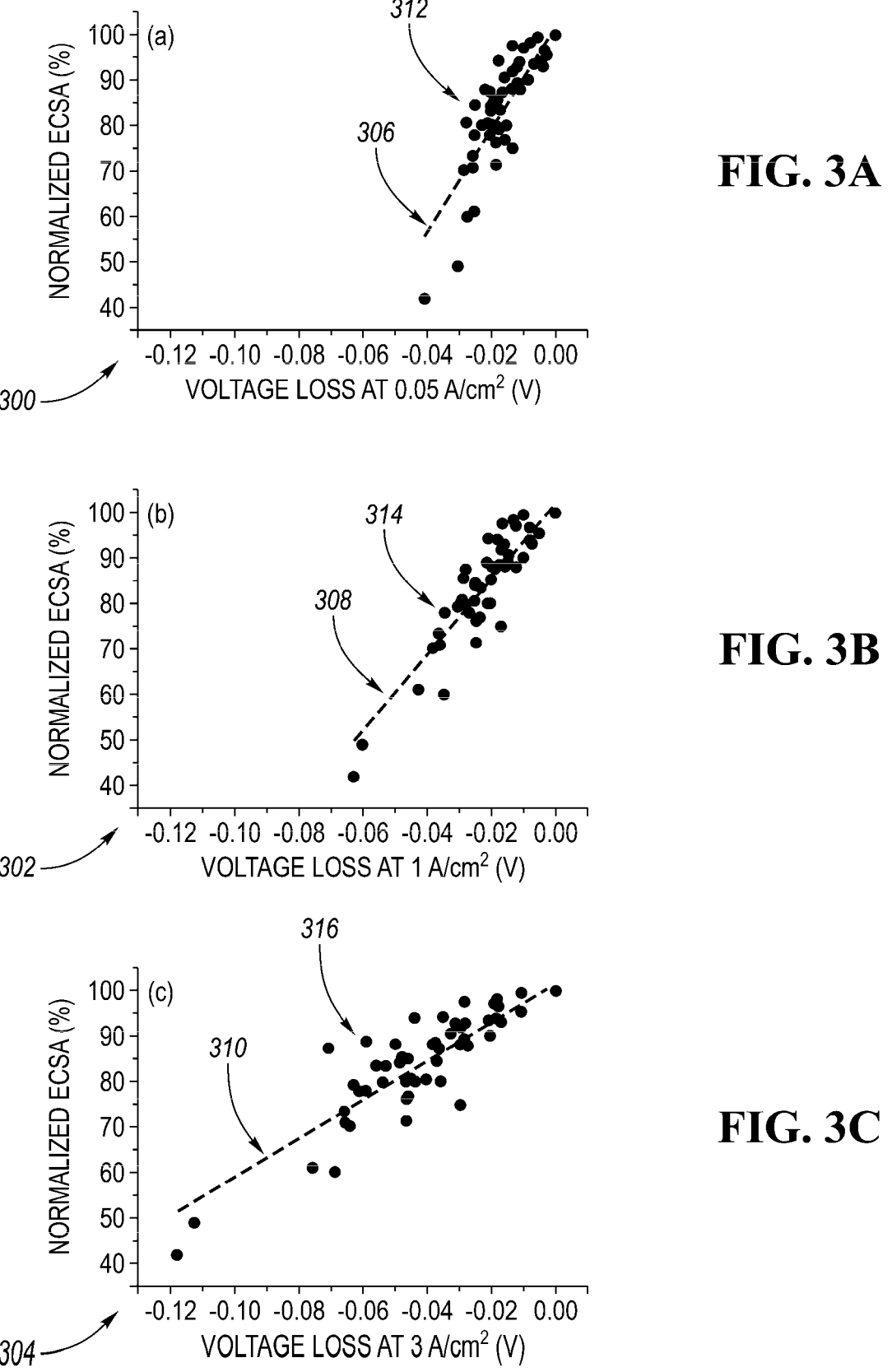
FIGS. 3A, 3B, and 3C depict first, second, and third graphs, respectively, of normalized electrochemically active surface area (ECSA) as a function of fuel cell voltage loss (V) at current densities of 0.05 A/cm², 1 A/cm², and 3 A/cm², respectively, at specific operating conditions of 80° C., 100% relative humidity, and 200 kPa pressure, respectively.

The aging models implemented within the SoH estimating method of one or more embodiments may use a linear regression analysis to correlate I-V characteristics with SoH estimates at different operating condition(s). FIGS. 3A, 3B, and 3C depict graphs 300, 302, and 304, respectively, of normalized electrochemically active surface area (ECSA) as a function of fuel cell voltage loss (V) at current densities of 0.05 A/cm$^2$, 1 A/cm$^2$, and 3 A/cm$^2$, respectively, at specific operating conditions of 80° C., 100% relative humidity, and 200 kPa pressure, respectively. As shown in FIGS. 3A, 3B, and 3C, linear regressions 306, 308, and 310, respectively, are drawn through data point clusters 312, 314, and 316, respectively. Linear regressions 306, 308, and 310 correlate monitored I-V characteristics versus normalized ECSA in connection with a SoH parameter. In one or more embodiments, a SoH parameter may be normalized ECSA. Different regions of the I-V curves may demonstrate varying sensitivity to ECSA loss. The varying sensitivity may provide redundancy for accuracy and/or may trigger a control algorithm.

While as described above linear regression may be utilized in the aging model implemented within SoH estimating methods of one or more embodiments, other models or combinations of models may be utilized. For example, machine learning based nonlinear modelling, stochastic modeling, and/or uncertainty qualification may be utilized. The model or models used may be used under different operating conditions to improve accuracy of the estimations of the SoH monitoring method. One example of a model that may be used in connection with the SoH monitoring method is a Gaussian Process Regression. The Gaussian Process Regression may output one or more nominal SoH parameters and one or more uncertainties associated with the one or more nominal SoH parameters. In one embodiment, the aging model may be combined with an electrochemical model based on fuel cell stack physics aging characteristics and/or advanced machine learning algorithms.

In one embodiment, a SoH monitoring method may be implemented using the following steps. In a first step, a series of measurement of fuel cell stack performance decay (e.g., reduction in normalized ECSA) are taken at various stages of degradation. These measurements may be used to establish a correlation or model of an SoH parameter (e.g., normalized ECSA) with measured I-V response. In one or more embodiments, this correlation may be determined using physics-based models and/or machine learning models to determine relationships between I-V responses and SoH parameters. The model may be practically integrated into a fuel cell stack management method. The SoH estimating method may be configured to obtain real-time I-V response during stack operation and estimate an SoH parameter in response to the I-V responses. The SoH parameter may be indicative of a fuel cell stack SoH.

Figure 4:
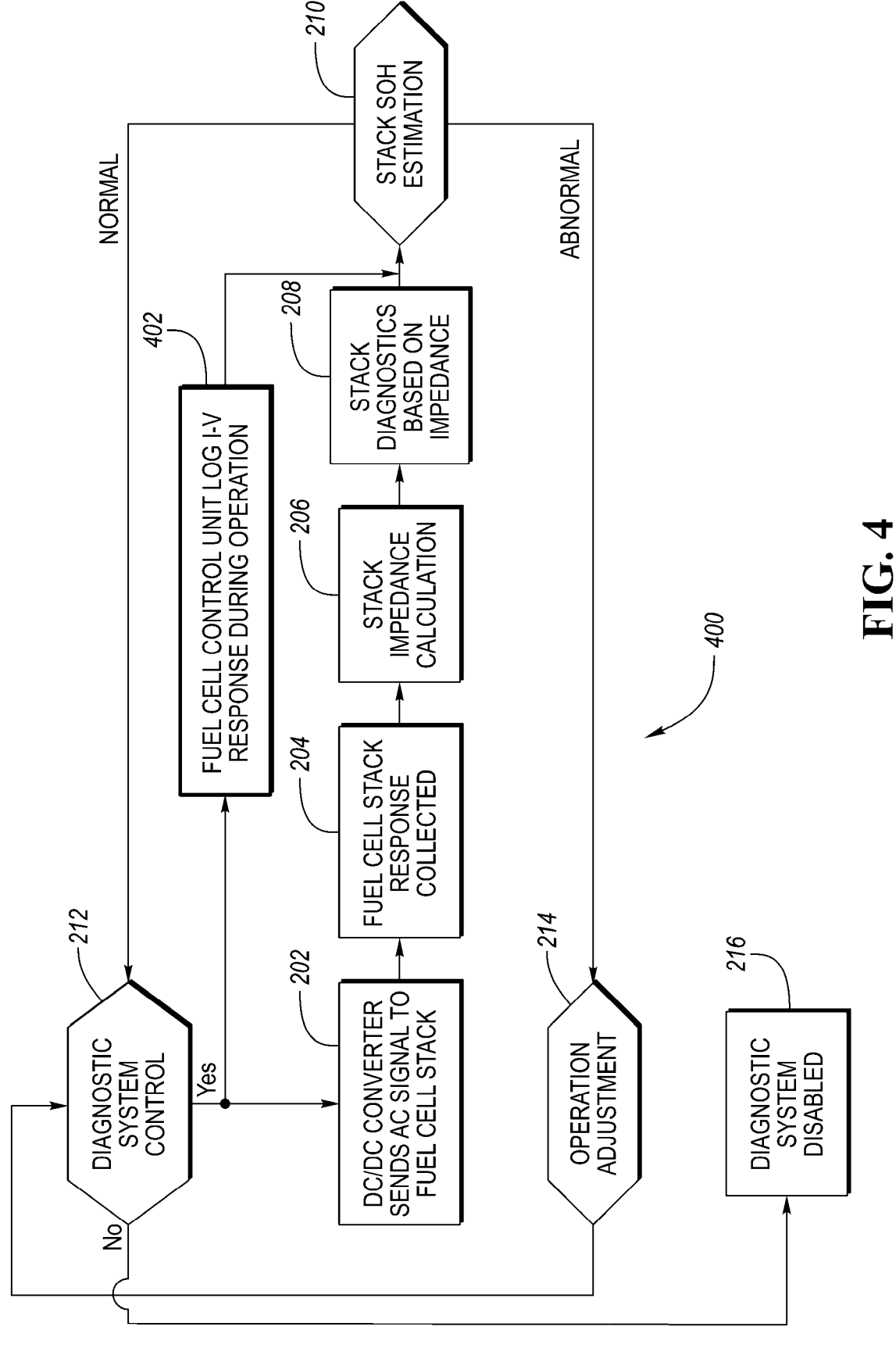
FIG. 4 depicts a flowchart of a method integrating an SoH estimating method into a DC/DC converter EIS model.

FIG. 4 depicts a flowchart of method 400 integrating an SoH estimating method into a DC/DC converter EIS model. Method 400 includes operation 402. Operation 402 utilizes a fuel cell control unit to log I-V responses during operation of a fuel cell. The I-V responses are used in combination with a stack impedance calculation to estimate a SoH estimate for the fuel cell stack.

Figure 5:
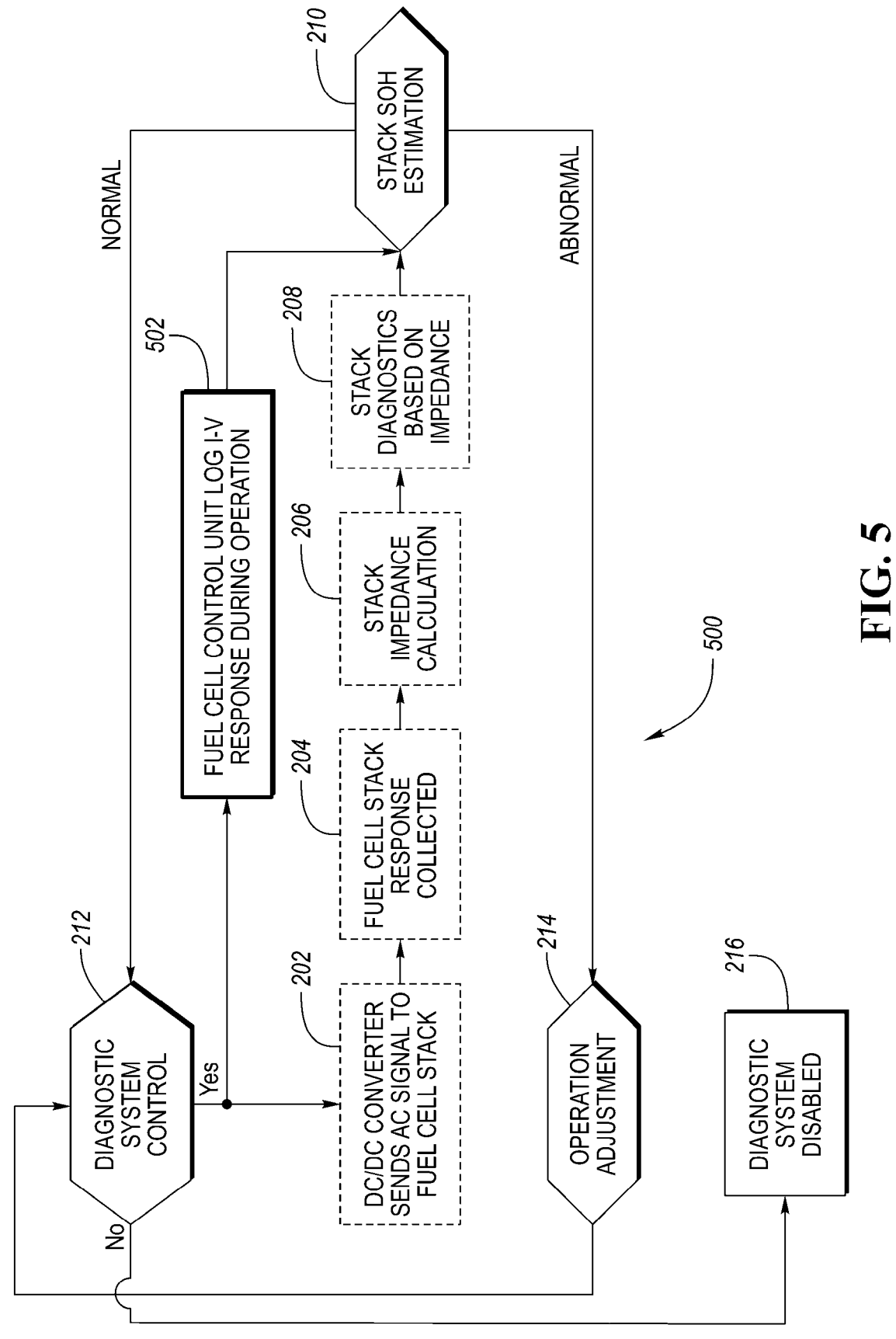
FIG. 5 depicts a flowchart of a method where the SoH monitoring where I-V response logging replaces the DC/DC converter EIS model.

FIG. 5 depicts a flowchart of method 500 where the SoH monitoring where I-V response logging replaces the DC/DC converter EIS model. As shown in FIG. 5, operation 502 utilizes a fuel cell control unit to log I-V responses during operation of a fuel cell. In this embodiment, operation 502 replaces operations 202, 204, 206, and 208. In this embodiment, the I-V responses are solely used to estimate a SoH estimate for the fuel cell stack.

Figure 6:
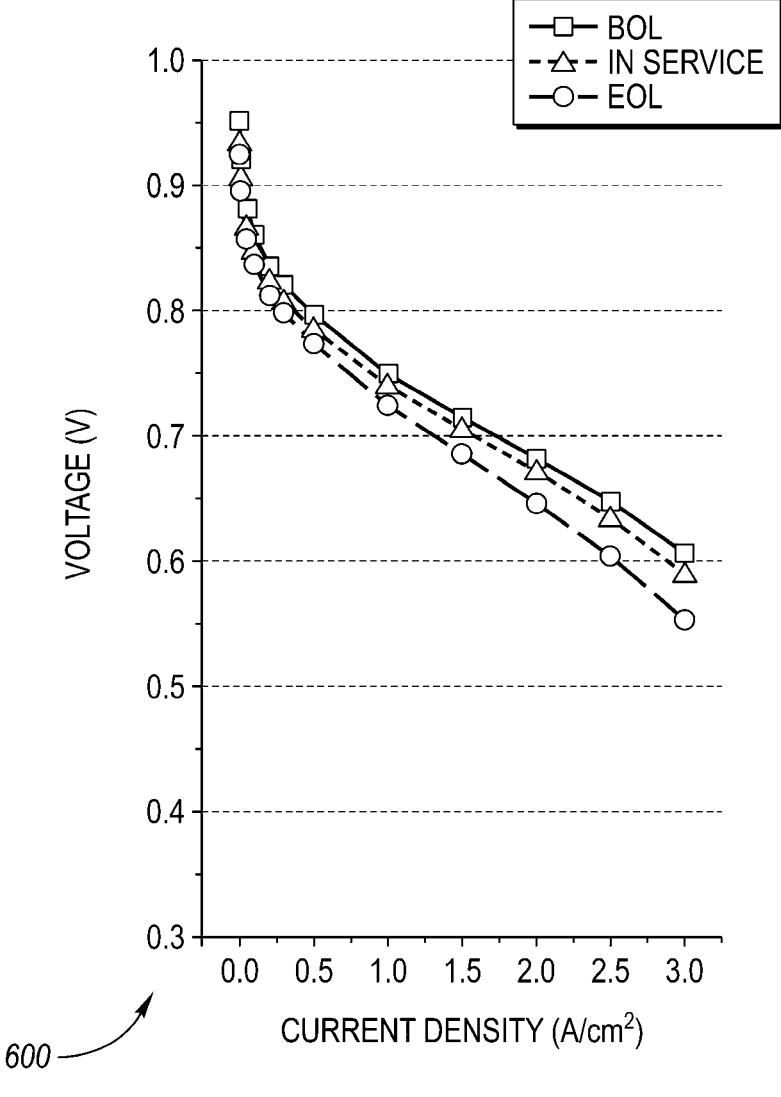
FIG. 6 is a graph showing example I-V characteristics of a fuel cell stack at different current densities at a specific operational condition of 80° C. and 100% relative humidity at beginning of life (BOL), in-operation, and end of life (EOL).

FIG. 6 is a graph showing example I-V characteristics of a fuel cell stack at different current densities at specific operational conditions of 80° C. and 100% relative humidity at beginning of life (BOL), in-operation, and end of life (EOL). As shown in FIG. 6, fuel cell voltage decays at the same current densities from BOL to EOL. As further shown in FIG. 6, fuel cell current decays at the same voltages from BOL to EOL.

FIG. 6 demonstrates a typical fuel cell system characteristic at one specific operational condition. For example, any voltage loss at any given current density may be estimated by comparing a real-time fuel cell stack current and voltage sensed values with voltage at the same current density at BOL. The BOL values may be built in by a comprehensive fuel cell stack performance model. In one or more embodiments, several verification measurements may be mapped before the fuel cell stack is commissioned for operation.

In one or more embodiments, fuel cell voltage may be automatically monitored and logged during normal fuel cell stack operations. During any point in fuel cell operation, a voltage loss may be determined by comparing the fuel cell voltage measurements to pre-loaded I-V characteristics at the same or substantially the same operational condition(s) at the BOL.

Figure 7A:
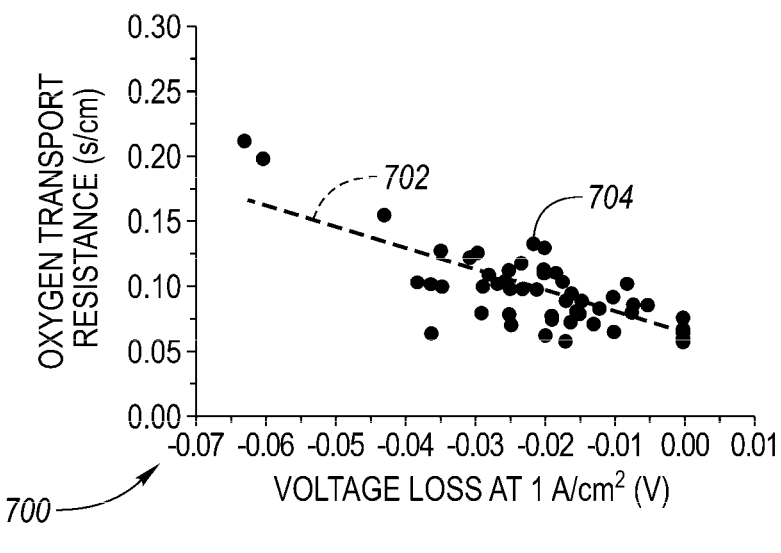
FIG. 7A depicts a graph of oxygen transport resistance (s/cm) as a function of fuel cell voltage loss (V) at a current density of 1 A/cm² at specific operating conditions of 80° C., 100% relative humidity, and 200 kPa pressure.

FIG. 7A depicts a graph 700 of oxygen transport resistance (s/cm) as a function of fuel cell voltage loss (V) at a current density of 1 A/cm² at specific operating conditions of 80° C., 100% relative humidity, and 200 kPa pressure. Linear regression 702 is drawn through data point cluster 704. Linear regression 702 may correlate monitored I-V characteristics versus oxygen transport resistance (s/cm) in connection with a SoH parameter. In one or more embodiments, a SoH parameter may be oxygen transport resistance (s/cm).

Figure 7B:
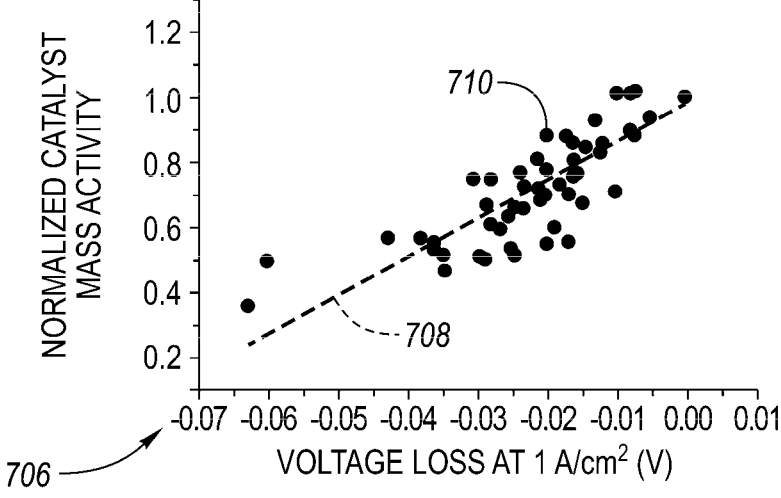
FIG. 7B depicts a graph of normalized catalyst mass activity as a function of fuel cell voltage loss (V) at a current density of 1 A/cm² at specific operating conditions of 80° C., 100% relative humidity, and 200 kPa pressure.

FIG. 7B depicts a graph 706 of normalized catalyst mass activity as a function of fuel cell voltage loss (V) at a current density of 1 A/cm² at specific operating conditions of 80° C., 100% relative humidity, and 200 kPa pressure. Linear regression 708 is drawn through data point cluster 710. Linear regression 708 may correlate monitored I-V characteristics versus normalized catalyst mass activity in connection with a SoH parameter. In one or more embodiments, a SoH parameter may be normalized catalyst mass activity.

The measured I-V response data may be used to identify degraded stacks or portions thereof that are candidates for replacement. A controller or control unit may vary the voltages, temperatures, or other operating parameters of the remainder of the device to compensate (e.g., increased voltage) or prevent further damage (e.g., decreased voltage).

In one or more embodiments, the measured I-V response data may be aggregated from multiple fuel cell systems (e.g., from multiple fleet vehicles). The aggregated data may be used to create an improved degradation model.

The processes, methods, or algorithms disclosed herein can be deliverable to and/or implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. An electrochemical state of health (SoH) estimating method for a polymer electrolyte fuel cell stack, the method comprising:

obtaining in-operation voltage and/or current signals from the polymer electrolyte fuel cell stack during operation of the polymer electrolyte fuel cell stack at one or more operational conditions;

determining an in-operation voltage-current relationship based on the in-operation voltage and/or current signals at the one or more operational conditions;

comparing the determined in-operation voltage-current relationship with a beginning of life (BOL) voltage-current relationship at the same or substantially the same one or more operational conditions to obtain a voltage-current comparison at the one or more operational conditions, the one or more operational conditions include relative humidity and/or pressure; and estimating an SoH parameter for the polymer electrolyte fuel cell stack in response to the voltage-current comparison.

2. The electrochemical SoH estimating method of claim 1, wherein the comparing step is carried out using an aging model.

3. The electrochemical SoH estimating method of claim 2, wherein the aging model includes a linear regression model.

4. The electrochemical SoH estimating method of claim 2, wherein the aging model includes a nonlinear model, a stochastic model, and/or an uncertainty qualification model.

5. The electrochemical SoH estimating method of claim 2, wherein the aging model includes a Gaussian Process Regression, and the SoH parameter includes one or more nominal SoH parameters and one or more uncertainties associated with the one or more nominal SoH parameters.

6. The electrochemical SoH estimating method of claim 1 further comprising adjusting the one or more operational conditions of the polymer electrolyte fuel cell stack in response to the SoH parameter.

7. The electrochemical SoH estimating method of claim 2, wherein the aging model includes a series of measurements of electrochemical performance decay and associated voltage-current relationships correlated to model SoH parameters.

8. The electrochemical SoH estimating method of claim 7, wherein the estimating step includes considering the series of measurements of electrochemical performance decay, the associated voltage-current relationships, and the model SoH parameters to estimate the SoH parameter.

9. The electrochemical SoH estimating method of claim 1, wherein the one or more operational conditions are measured with one or more polymer electrolyte fuel cell stack sensors.

10. The electrochemical SoH estimating method of claim 1, wherein the one or more operational conditions include relative humidity.

11. The electrochemical SoH estimating method of claim 1, wherein the SoH parameter is decay of the polymer electrolyte fuel cell stack.

12. The electrochemical SoH estimating method of claim 1, wherein the SoH parameter is lifetime loss of the polymer electrolyte fuel cell stack.

13. The electrochemical SoH estimating method of claim 1, wherein the SoH parameter is voltage loss of the polymer electrolyte fuel cell stack.

14. The electrochemical SoH estimating method of claim 1, wherein the operational conditions are only measured with one or more polymer electrolyte fuel cell stack sensors.

15. The electrochemical SoH estimating method of claim 1, wherein the one or more operational conditions include pressure.

16. The electrochemical SoH estimating method of claim 1, wherein the polymer electrolyte fuel cell stack is an individual polymer electrolyte fuel cell in the polymer electrolyte fuel cell stack.

17. The electrochemical SoH estimating method of claim 1, wherein the SoH parameter is oxygen transport resistance.

18. The electrochemical SoH estimating method of claim 1, wherein the SoH parameter is normalized catalyst mass activity.

19. An electrochemical state of health (SoH) estimating method for a polymer electrolyte fuel cell stack, the method comprising:

obtaining in-operation voltage and/or current signals from the polymer electrolyte fuel cell stack during operation of polymer electrolyte fuel cell stack at one or more operational conditions;

determining an in-operation voltage-current relationship based on the in-operation voltage and/or current signals at the one or more operational conditions;

comparing the determined in-operation voltage-current relationship with a beginning of life (BOL) voltage-current relationship at the same or substantially the same one or more operational conditions to obtain a voltage-current comparison at the one or more operational conditions, the one or more operational conditions include relative humidity and/or pressure;

receiving an impendence calculation based on a response to an alternating current (AC) signal sent to the polymer electrolyte fuel cell stack; and estimating an SoH parameter for the polymer electrolyte fuel cell stack in response to the voltage-current comparison and the impedance calculation.

20. An electrochemical state of health (SoH) estimating method for a polymer electrolyte fuel cell stack, the method comprising:

obtaining in-operation voltage and/or current signals from the polymer electrolyte fuel cell stack during operation of the polymer electrolyte fuel cell stack at one or more operational conditions;

determining an in-operation voltage-current relationship based on the in-operation voltage and/or current signals at the one or more operational conditions;

comparing the determined in-operation voltage-current relationship with a beginning of life (BOL) voltage-current relationship at the same or substantially the same one or more operational conditions to obtain a voltage-current comparison at the one or more operational conditions, the one or more operational conditions include relative humidity and/or pressure;

estimating an SoH parameter for the polymer electrolyte fuel cell stack in response to the voltage-current comparison; and transmitting the SoH parameter for the polymer electrolyte fuel cell stack to a diagnostics system of the polymer electrolyte fuel cell stack.

* * * * *